(12) United States Patent
Khesin et al.

(10) Patent No.: US 11,816,086 B2
(45) Date of Patent: Nov. 14, 2023

(54) COSHARDING AND RANDOMIZED COSHARDING

(71) Applicant: Google LLC, Mountain View, CA (US)

(72) Inventors: Alexander Khesin, Hoboken, NJ (US); Alexander Lloyd, New York, NY (US); Sebastian Kanthak, Los Altos, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 18/069,519

(22) Filed: Dec. 21, 2022

(65) Prior Publication Data

US 2023/0214374 A1 Jul. 6, 2023

Related U.S. Application Data

(63) Continuation of application No. 17/296,441, filed as application No. PCT/US2020/023330 on Mar. 18, 2020, now Pat. No. 11,561,953.

(60) Provisional application No. 62/821,256, filed on Mar. 20, 2019.

(51) Int. Cl.
   *G06F 16/22* (2019.01)
   *G06F 16/27* (2019.01)
   *G06F 16/2458* (2019.01)

(52) U.S. Cl.
   CPC ...... *G06F 16/2282* (2019.01); *G06F 16/2477* (2019.01); *G06F 16/27* (2019.01)

(58) Field of Classification Search
   CPC .................................................. G06F 16/2282
   USPC .............................................................. 707/736
   See application file for complete search history.

(56) References Cited

U.S. PATENT DOCUMENTS

| | | | |
|---|---|---|---|
| 9,483,568 B1 | 11/2016 | Fontoura et al. | |
| 2003/0217033 A1* | 11/2003 | Sandler | G06F 16/2272 |
| 2012/0084316 A1* | 4/2012 | Koenig | G06F 16/2471 |
| | | | 707/769 |
| 2013/0346540 A1 | 12/2013 | Dean et al. | |
| 2014/0108421 A1* | 4/2014 | Isaacson | G06F 16/27 |
| | | | 707/747 |

(Continued)

OTHER PUBLICATIONS

"Schema and Data Model." Google Cloud. Cloud Spanner. Documentation. Jan. 2, 2019. pp. 15. Retrieved from the internet: <https://cloud.google.com/spanner/docs/schema-and-data-model>.

(Continued)

*Primary Examiner* — Muluemebet Gurmu
(74) *Attorney, Agent, or Firm* — Lerner David LLP

(57) ABSTRACT

The technology relates to cosharding tables within a distributed storage system. A data table including one or more rows may be received. Each row in the data table may include an identifier key and pieces of data. Each piece of data in the data table may be indexed into individual rows of an index table, wherein each row in the index table includes data associated with the identifier key of the data table from which the piece of data in the respective row was indexed. The index table may be sharded into splits, wherein the sharding includes assigning each row of the index table into one of the splits based on the identifier key of the data table from which the piece of data in the respective row was indexed. The splits may be stored into two or more portions of the distributed storage system.

17 Claims, 12 Drawing Sheets

(56) References Cited

U.S. PATENT DOCUMENTS

2019/0361916 A1* 11/2019 Weaver ............... G06F 16/2365

OTHER PUBLICATIONS

"Optimizing Schema Design for Cloud Spanner" Google Cloud. Cloud Spanner. pp. 7. Jan. 22, 2019. Retrieved from the internet: <https://cloud.google.com/spanner/docs/whitepapers/optimizing-schema-design>.

"Cloud Spanner—Choosing the Right Primary Keys" pp. 8. Retrieved from: <https://medium.com/google-cloud/cloud-spanner-choosing-the-right-primary-keys-cd2a47c7b52d>.

"Optimizing Schema Design for Cloud Spanner." Google Cloud. Documentation. pp. 7. Jan. 22, 2019. Retrieved from: <https://cloud.google.com/spanner/docs/whitepapers/optimizing-schema-design>.

Information Retrieval. ETH Zurich, Fall 2012. Thomas Hofmann. Lecture 2 Indexing. Sep. 26, 2012. pp. 59.

Gao. Investigation and Comparison of Distributed NoSQL Database Systems. Aug. 29, 2017 (Aug. 29, 2017), XP055691698, 14 pages. Retrieved from the Internet: <http://grids.ucs.indiana.edu/ptliupages/publications/NoSQL_databases.pdf [retrieved on May 5, 2020].

Invitation to Pay Additional Fees for International Application No. PCT/US2020/023330 dated May 18, 2020. 15 pages.

International Search Report and Written Opinion for International Application No. PCT/US2020/023330 dated Jul. 9, 2020. 17 pages.

International Preliminary Report on Patentability for International Application No. PCT/US2020/023330 dated Sep. 30, 2021. 11 pages.

Gao ("Investigation and Comparison of Distributed NoSQL Database Systems", Aug. 29, 2017) (Year: 2017).

Office Action for European Patent Application No. 20717741.1 dated Jul. 4, 2022. 7 pages.

Office Action for Korean Patent Application No. 10-2021-7013584 dated Sep. 20, 2023. 7 pages.

Gao. Investigation and Comparison of Distributed NoSQL Database Systems. Aug. 29, 2017. 14 pages.

* cited by examiner

COSHARDING AND RANDOMIZED COSHARDING

CROSS-REFERENCE TO RELATED APPLICATIONS

The present application claims the benefit of the filing date of U.S. Provisional Application No. 62/821,156, filed on Mar. 20, 2019, entitled Cosharding and Randomized Cosharding, the disclosure of which is hereby incorporated herein by reference.

BACKGROUND

Relational databases generally operate with data arranged in tables for efficient storage and retrieval. As a table grows, the data is typically spread across a number of database servers. However, separation of a table to different database servers may reduce the relational database's efficiency at retrieving data. In this regard, distributed operations (i.e., operations which require communication between the different database servers or components within a database center) may be required to locate and retrieve data being retrieved.

BRIEF SUMMARY

The present disclosure generally relates to cosharding tables. One aspect of the technology is directed to a method for cosharding tables within a distributed storage system. The method may include receiving, by one or more processors, a data table including one or more rows, wherein each row includes an identifier key and pieces of data; indexing, by the one or more processors, each piece of data in the data table into individual rows of an index table, wherein each row in the index table includes data associated with the identifier key of the data table from which the piece of data in the respective row was indexed; sharding, by the one or more processors, the index table into splits, wherein the sharding includes assigning each row of the index table into one of the splits based on the identifier key of the data table from which the piece of data in the respective row was indexed; and storing, by the one or more processors, the splits into two or more portions of the distributed storage system.

In some examples, the one or more rows from the data table may be sharded together with the one or more index table rows to which the pieces of data of the respective row of the data table were indexed. In some instances, the one or more rows from the data table may be stored in the same split as the one or more index table rows to which the pieces of data of the respective row of the data table were indexed.

In some examples, the data in the data table may be in one or more columns of the data table.

In some examples, wherein the identifier key may include randomly generated number. In some instances, the identifier key may include a timestamp. In some examples, the splits may be sorted by the timestamp.

In some examples the identifier key may include a monotonically increasing or decreasing value. In some instances, the splits may be sorted by the monotonically increasing or decreasing value.

In some examples, the entire index table may be sharded into the splits.

In some examples, storing the splits into two or more portions of the distributed storage system may include storing a first split into a first portion of the two or more portions of the distributed storage system and a second split into a second portion of the two or more portions of the distributed storage system.

In some examples, the method may include: receiving a request to retrieve one or more keys associated with the indexed pieces of data; in response to receiving the request, identifying in the first split, by a first server of the distributed data system, and in the second split, by a second server of the distributed data system, the one or more keys associated with the indexed pieces of data; merging the identified keys from the first and second splits; and outputting, by the distributed data system, the merged keys.

In some examples, each row in the data table gets indexed into the index table transactionally in a relational online database stored in the distributed storage system.

Another aspect of the technology is directed to a system for cosharding a table. The system may comprise: a distributed storage system; and one or more processors, wherein the one or more processors are configured to: receive a data table including one or more rows, wherein each row includes an identifier key and pieces of data; index each piece of data in the data table into individual rows of an index table, wherein each row in the index table includes data associated with the identifier key of the data table from which the piece of data in the respective row was indexed; shard the index table into splits, wherein the sharding includes assigning each row of the index table into one of the splits based on the identifier key of the data table from which the piece of data in the respective row was indexed; and store the splits into two or more portions of the distributed storage system.

In some examples, the one or more processors may be configured to shard the one or more rows from the data table together with the one or more index table rows to which the pieces of data of the respective row of the data table were indexed. In some instances, the one or more rows from the data table may be stored in the same split as the one or more index table rows to which the pieces of data of the respective row of the data table were indexed.

In some examples, the data in the data table may be in one or more columns of the data table.

In some examples, the identifier key may include a timestamp. In some instances, the splits are sorted by the timestamp.

In some examples, storing the splits into two or more portions of the distributed storage system include storing a first split into a first portion of the two or more portions of the distributed storage system and a second split into a second portion of the two or more portions of the distributed storage system. In some instances, in response to receiving the request to retrieve one or more keys associated with the indexed pieces of data, identifying in the first split, by a first server of the distributed data system, and in the second split, by a second server of the distributed data system, the one or more keys associated with the indexed pieces of data; merging the identified keys from the first and second splits; and outputting, by the distributed data system, the merged keys.

In some examples, each row in the data table gets indexed into the index table transactionally in a relational online database stored in the distributed storage system.

Another aspect of the technology is directed to a method for cosharding tables within a distributed storage system. The method may include: receiving, by one or more processors, a data table including one or more rows and a plurality of columns, wherein each row corresponding to a first column of the plurality of columns includes an identifier key and second and third columns of the plurality of columns each include pieces of data; indexing, by the one or more processors, each piece of data in the second column in the data table into individual rows and columns of a first index table, wherein each row in the index table includes data associated with the identifier key of the data table from which the piece of data in the respective row was indexed; indexing, by the one or more processors, each piece of data in the third column in the data table into individual rows and columns of a second index table, wherein each row in the index table includes data associated with the identifier key of the data table from which the piece of data in the respective row was indexed; sharding, by the one or more processors, the first index table and the second index into splits, wherein the sharding includes assigning each row of the first and second index tables into one of the splits based on the identifier key of the data table from which the piece of data in the respective row was indexed; and storing, by the one or more processors, the splits into two or more portions of the distributed storage system.

The methods described herein may be implemented using one or more computing devices and/or systems. The methods may be stored in computer-readable media such as a non-transitory computer readable medium.

DETAILED DESCRIPTION

Overview

The technology relates generally to sharding (i.e., splitting) an index table such that entries are stored in splits based on the keys of another table and maintaining these cosharded indexes transactionally in a relational online database. Maintaining indexes transactionally in a relational online database may include, for each new row of data which is added to the storage system, indexing the row atomically (transactionally) with the operation that added the document, such that both the row and the index may become visible to queries when the transaction completes. With increasing amounts of data, a distributed storage system may store the data from a data table into an index table that indexes data from rows in the data table to individual keys in the index table. Each row in the index table may include a key and data which maps the key back to the row in the data table from which it was indexed. The index table may be sharded by row into splits based on the keys of the rows in the index table. The shards may be stored in different portions (e.g., servers, storage devices, etc.) of the distributed storage system. However, sharding an index table by keys of the rows in the index table may result in the keys corresponding to a single data table row being spread across multiple portions of the distributed storage system. As such, when the index table is searched, distributed operations (i.e., operations which require communication between the different portions of the distributed storage system), such as joining the search results from each portion of the distributed storage system, may be required to determine whether the data being searched for is located within a single row of the data table.

Figure 1:
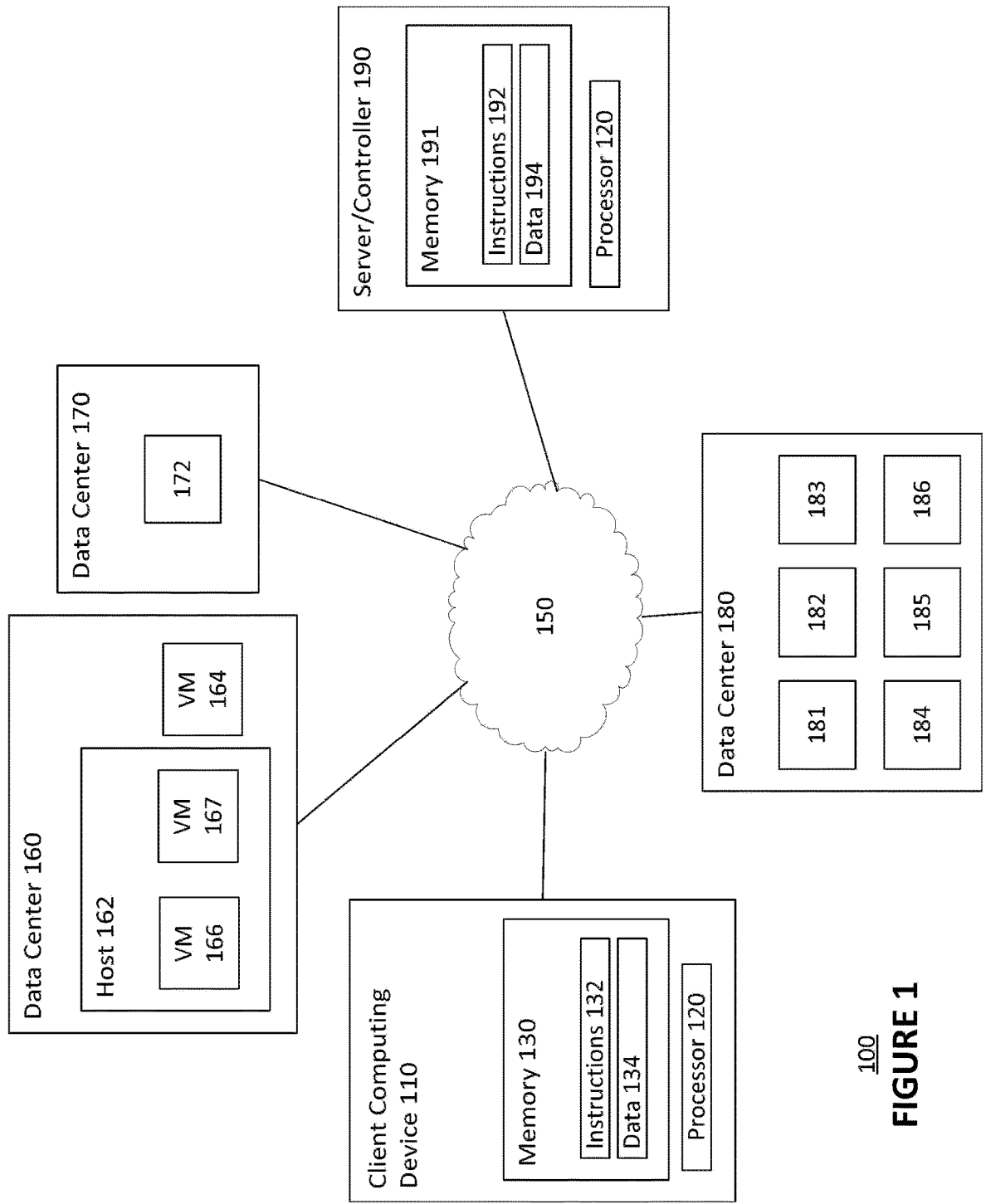
FIG. 1 is a block diagram of an example system within a distributed storage system according to aspects of the disclosure.

To reduce the number of distributed operations needed to determine whether the data being searched for is located within a row of the data table, the index may be sharded by keys of the data table or another index table. By doing such, the rows in the index table may be sharded into splits, such that all index table keys corresponding to one data table row are found in a single split. Therefore the determination of whether a given data table row matches the query can be made locally (i.e., on one portion of the distributed storage system). Although the examples herein describe indexing a data table into a single index table, the data table may be indexed into more than one index table and these index tables may be sharded by keys of a data table or other index table Example System FIG. 1 illustrates an example system 100 including a distributed storage system. A plurality of datacenters 160, 170, 180 may be communicatively coupled, for example, over a network 150. The datacenters 160, 170, 180 may further communicate with one or more client devices, such as client computing device 110, over the network 150. Thus, for example, the client computing device 110 may execute operations in "the cloud." In some examples, the datacenters 160, 170, 180 may further communicate with a server/controller 190.

Each client computing device 110 may be a personal computer, intended for use by a person having all the internal components normally found in a personal computer such as a central processing unit (CPU), CD-ROM, hard drive, and a display device, for example, a monitor having a screen, a projector, a touch-screen, a small LCD screen, a television, or another device such as an electrical device that can be operable to display information processed by processor 120, speakers, a modem and/or network interface device, user input, such as a mouse, keyboard, touch screen or microphone, and all of the components used for connecting these elements to one another. Moreover, computers in accordance with the systems and methods described herein may include devices capable of processing instructions and transmitting data to and from humans and other computers including general purpose computers, PDAs, tablets, mobile phones, smartwatches, network computers lacking local storage capability, set top boxes for televisions, and other networked devices.

The client computing device 110 may contain a processor 120, memory 130, and other components typically present in general purpose computers. The memory 130 can store information accessible by the processor 120, including instructions 132 that can be executed by the processor 120. Memory 130 can also include data 134 that can be retrieved, manipulated or stored by the processor 120. The memory 130 may be a type of non-transitory computer readable medium capable of storing information accessible by the processor 120, such as a hard-drive, solid state drive, tape drive, optical storage, memory card, ROM, RAM, DVD, CD-ROM, write-capable, and read-only memories. The processor 120 can be a well-known processor or other lesser-known types of processors. Alternatively, the processor 120 can be a dedicated controller such as an ASIC.

The instructions 132 can be a set of instructions executed directly, such as machine code, or indirectly, such as scripts, by the processor 120. In this regard, the terms "instructions," "steps" and "programs" can be used interchangeably herein. The instructions 132 can be stored in object code format for direct processing by the processor 120, or other types of computer language including scripts or collections of independent source code modules that are interpreted on demand or compiled in advance.

The data 134 can be retrieved, stored or modified by the processor 120 in accordance with the instructions 132. For instance, although the system and method is not limited by a particular data structure, the data 134 can be stored in computer registers, in a distributed storage system as a structure having a plurality of different fields and records, or documents, or buffers. The data 134 can also be formatted in a computer-readable format such as, but not limited to, binary values, ASCII or Unicode. Moreover, the data 134 can include information sufficient to identify relevant information, such as numbers, descriptive text, proprietary codes, pointers, references to data stored in other memories, including other network locations, or information that is used by a function to calculate relevant data.

Although FIG. 1 functionally illustrates the processor 120 and memory 130 as being within the same block, the processor 120 and memory 130 may actually include multiple processors and memories that may or may not be stored within the same physical housing. For example, some of the instructions 132 and data 134 can be stored on a removable CD-ROM and others within a read-only computer chip. Some or all of the instructions and data can be stored in a location physically remote from, yet still accessible by, the processor 120. Similarly, the processor 120 can actually include a collection of processors, which may or may not operate in parallel.

The datacenters 160, 170, 180 may be positioned a considerable distance from one another. For example, the datacenters may be positioned in various countries around the world. Each datacenter 160, 170, 180 may include one or more computing devices, such as processors, servers, shards, or the like. For example, as shown in FIG. 1, datacenter 160 includes computing devices 162, 164, datacenter 170 includes computing device 172, and datacenter 180 includes computing devices 181-186. According to some examples, the computing devices may include one or more virtual machines running on a host machine. For example, computing device 162 may be a host machine, supporting a plurality of virtual machines 166, 167 running an operating system and applications. While only a few virtual machines 166, 167 are illustrated in FIG. 1, it should be understood that any number of virtual machines may be supported by any number of host computing devices. Moreover, it should be understood that the configuration illustrated in FIG. 1 is merely an example, and that the computing devices in each of the example datacenters 160, 170, 180 may have various structures and components that may be the same or different from one another.

Programs may be executed across these computing devices, for example, such that some operations are executed by one or more computing devices of a first datacenter while other operations are performed by one or more computing devices of a second datacenter. In some examples, the computing devices in the various datacenters may have different capacities. For example, the different computing devices may have different processing speeds, workloads, etc. While only a few of these computing devices are shown, it should be understood that each datacenter 160, 170, 180 may include any number of computing devices, and that the number of computing devices in a first datacenter may differ from a number of computing devices in a second datacenter. Moreover, it should be understood that the number of computing devices in each datacenter 160, 170, 180 may vary over time, for example, as hardware is removed, replaced, upgraded, or expanded.

Moreover, various backend systems may be built upon the distributed storage system. For example, identity management systems, domain name server (DNS) setting management systems, etc. Such backend systems may to some extent be interrelated. For example, a user of the DNS setting management system may log in using an identification managed by the identity management system.

In some examples, each datacenter 161, 170, 180 may also include a number of storage devices (not shown), such as hard drives, random access memory, disks, disk arrays, tape drives, or any other types of storage devices. The datacenters 160, 170, 180 may implement any of a number of architectures and technologies, including, but not limited to, direct attached storage (DAS), network attached storage (NAS), storage area networks (SANs), fibre channel (FC), fibre channel over Ethernet (FCoE), mixed architecture networks, or the like. The datacenters may include a number of other devices in addition to the storage devices, such as cabling, routers, etc. Further, in some examples the datacenters 160, 170, 180 may be virtualized environments. Further, while only a few datacenters 1160, 170, 180 are shown, numerous datacenters may be coupled over the network 150 and/or additional networks.

In some examples, the controller 190 may communicate with the computing devices in the datacenters 160, 170, 180, and may facilitate the execution of programs. For example, the controller 190 may track the capacity, status, workload, or other information of each computing device, and use such information to assign tasks. The controller 190 may include a processor 120 and memory 191, including data 194 and instructions 192, similar to the client computing device 110 described above. The controller 190 may be configured to populate changes affecting authorization parameters to various components of the distributed storage system without shutting down service to users. For example, the controller 190 may have knowledge of an organizational structure, and do mappings to populate the changes affecting the authorization parameters throughout the organizational structure.

Client computing device 110, datacenters 160, 170, 180, and controller 190 can be capable of direct and indirect communication such as over network 150. For example, using an Internet socket, a client computing device 110 can connect to a service operating on remote servers through an Internet protocol suite. Servers can set up listening sockets that may accept an initiating connection for sending and receiving information. The network 150, and intervening nodes, may include various configurations and protocols including the Internet, World Wide Web, intranets, virtual private networks, wide area networks, local networks, private networks using communication protocols proprietary to one or more companies, Ethernet, WiFi (e.g., 702.71, 702.71b, g, n, or other such standards), and HTTP, and various combinations of the foregoing. Such communication may be facilitated by a device capable of transmitting data to and from other computers, such as modems (e.g., dial-up, cable or fiber optic) and wireless interfaces.

Client computing device 110 may request access to a program utilizing one of the backend systems in the cloud. Such requests may be handled by the controller 190 and/or one or more of the computing devices in datacenters 160, 170, 180. When changes are made that affect authorization, such as changing access rights for particular roles, such changes may be permeated through the distributed storage system using inference, reasoning, and transport, without shutting down the backend systems or otherwise disrupting service to the client computing device 110.

Example Methods

Figure 2:
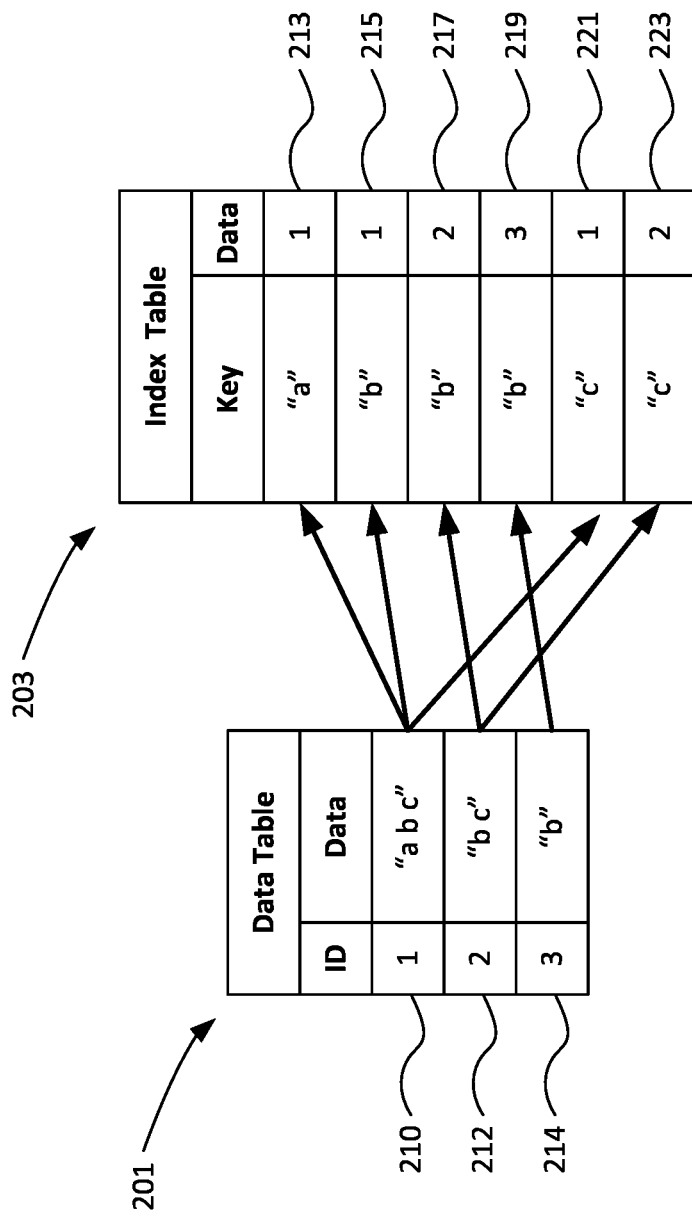
FIG. 2 is an illustration of generating an index table from a data table in accordance with aspects of the disclosure.

The data input into a distributed storage system may be in the form of a data table. In this regard, the data table may include one or more identifier key (ID) for each row and data corresponding to each identifier key. An example data table 201 is shown in FIG. 2. The data table 201 includes three identifier keys '1', '2', and '3'. The data within the row of ID '1' 210 includes data 'a b c', the data within the row of ID '2' 212 includes data 'b c', and the data within the row of ID '3' 214 includes data 'b'. Data 'a''b' and 'c' may represent distinct pieces of data, such as individual words in a text entry, entire text entries, parts of file, entire files, etc. Although the data corresponding to each identifier key is shown as being within a single column in data table 201, data associated with an identifier key may be within multiple columns in a row. Moreover, for row entries having more than one identifier key, the identifier keys may be spread across multiple columns in the row. For instance, the data within the row of ID '1' may be included in three columns, with data 'a' being in a first column, data 'b' being within a second column, and data 'c' being within a third columns Any number of columns may be present in a row.

Each piece of data in the data table 201 may be indexed into individual rows of an index table. In this regard, each piece of data may be indexed, by a server or controller, such as controller 190, into a corresponding key within a row of the index table. For example, FIG. 2 further illustrates the data associated with ID '1' (i.e., 'a''b' and 'c') in row 210 of the data table 201 being indexed into rows 213, 215, and 221 corresponding to keys 'a', 'b', and 'c', respectively, of index table 203. The data associated with ID '2' (i.e., 'b' and 'c') in row 212 as well as the data associated with ID '3' (i.e., 'b') in row 214 of data table 201 are indexed into row 217, 223, 219 which correspond to keys 'b', 'c', and 'b', respectively, in the index table 203. For data tables having multiple identifier keys, one or more of the identifier keys may be used to index the corresponding data.

Each key in the index table 203 may correspond to data indicating the identifier key of the data table from which the data indexed into the key of the index table is located. For example, the rows corresponding to keys 'a' (row 213), 'b' (row 215), and 'c' (row 221) in index table 203 include data '1' which indicates the identifier key corresponding to row 210 in the data table 201 where the data indexed into the keys 'a', 'b', and 'c' are located. Similarly, the rows of keys 'b' (row 217) and 'c' (row 223) include data '2' which indicates the identifier key corresponding to row 212 in the data table 201. The row of key 'b' (row 219) includes '3' which indicates the identifier key corresponding to row 214 in the data table 201. In instances where an index table (a first index table) is created from another index table (a second index table), the first index table may include data indicating the key of the second index table from which the data indexed into the key of the first index table corresponds. Although data from the data table 201 are shown as being indexed into the key column of the index table 203, some or all data from the data table 201 may be placed into the data column of the index table. Similarly, although the IDs of data table 201 are shown as being indexed into the data column of the index table 203, some or all of the IDs may be placed into the key column of the index table 203.

Figure 3A:
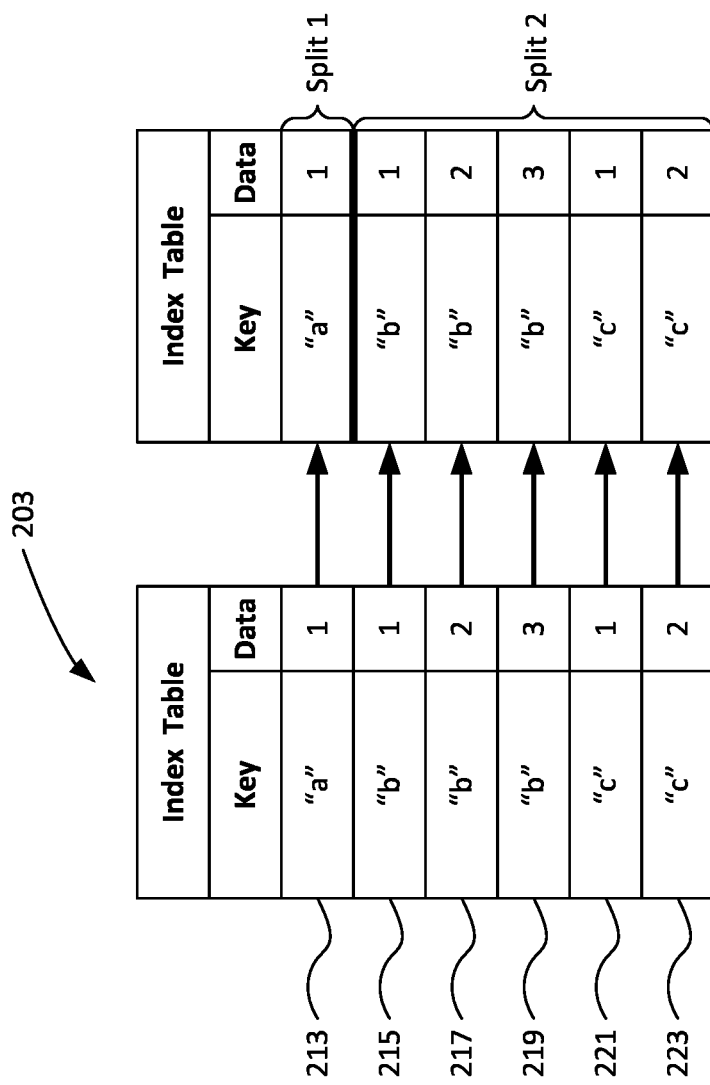
FIG. 3A is an illustration of sharding an index table based on the index table's keys in accordance with aspects of the disclosure.

The index table may be sharded by ranges of keys into splits. Sharding an index table may include splitting the index table into splits and storing the splits in different portions of the distributed storage system. In a typical distributed storage system the index table may be sharded by rows according to the index table's keys. FIG. 3A shows an example of the index table 203 being sharded into split 1 and split 2 by rows according to the keys of the index table 203. In this regard, split 1 includes row 213 of the index table having an 'a' key and split 2 includes rows of the index table 215-223 having 'b' and 'c' keys.

Figure 3B:
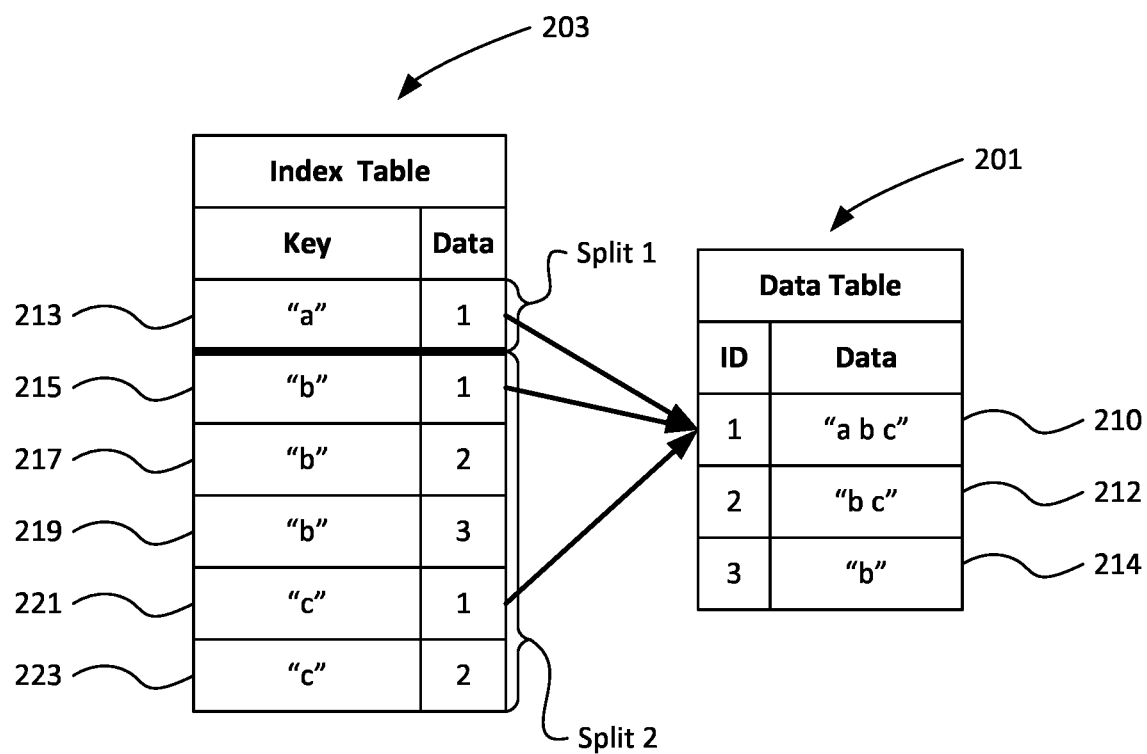
FIG. 3B is an illustration showing how keys in an index table map back to rows in a data table in accordance with aspects of the disclosure.

Sharding an index table by the keys of the index table may result in the keys corresponding to a single data table row being spread across multiple portions of the distributed storage system. For example, and as illustrated in FIG. 3B, split 1 of index table 203 includes row 213 having key 'a', which indexes data 'a' of the data in the data table row identified by identifier key '1'—row 210. Split 2 includes rows 215 and 221 having keys 'b' and 'c', respectively, which index data 'b' and 'c', the remaining data in the data table row identified by identifier key '1'— row 210. Each data split may be stored in different portions of the distributed storage system. For instance, split 1 may be stored in a first portion of the distributed storage system and split 2 may be stored in a second portion of the distributed storage system.

Figure 4A:
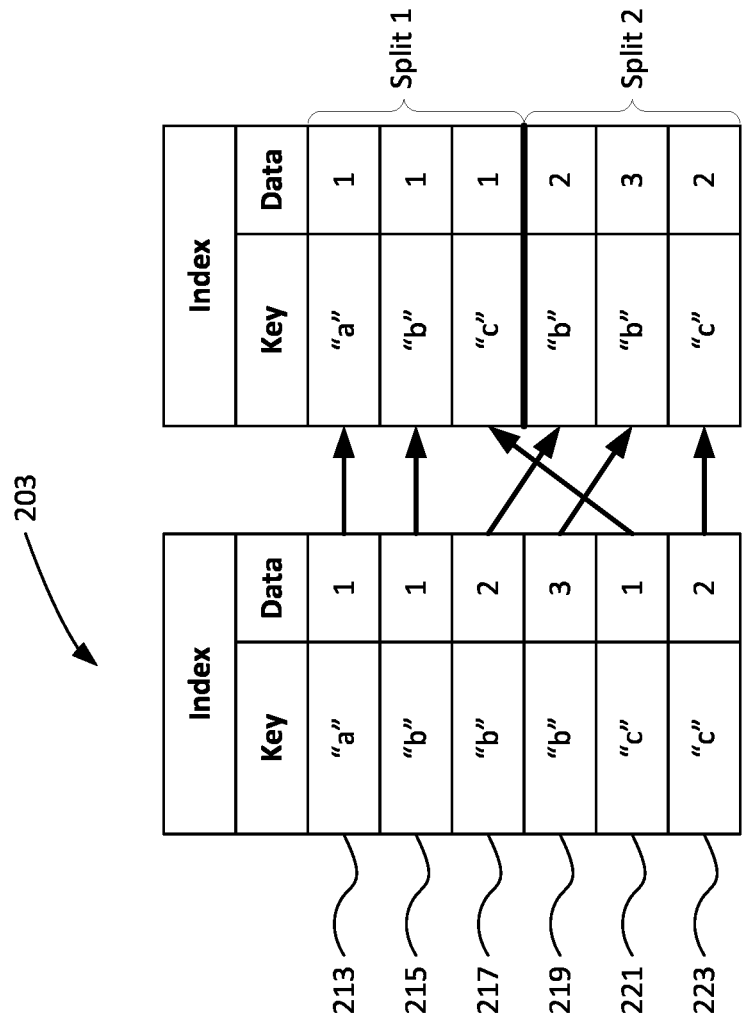
FIG. 4A is an illustration of sharding an index table based on the keys of a data table in accordance with aspects of the disclosure.

The sharding of the index table may be based on the identifier keys of a data table and/or another index table, as opposed to sharding by the keys of the index table. Sharding an index table based on the identifier keys of a data table and/or another index table may be called cosharding. By cosharding rows of the index table corresponding to identifier keys of a data table, all indexed entries in a data table corresponding to the same row in a data table may be arranged within the same split. For example, and as shown in FIGS. 4A, the index table may be sharded into two splits, split 1 and split 2, based on the identifier key of the data table 201. In this regard, the rows of keys having data '1' in the index table, including rows 213, 215, and 221, which indicates the identifier key corresponding to row 210 of the data table (not shown), are sharded into split 1. The rows of keys having data '2' in the index table, including rows 217 and 223, which indicate the identifier key corresponds to row 212 of the data table and the rows of keys having data '3', including row 219, which indicate the identifier key corresponds to row 214 of the data table, are sharded into split 2.

Figure 4B:
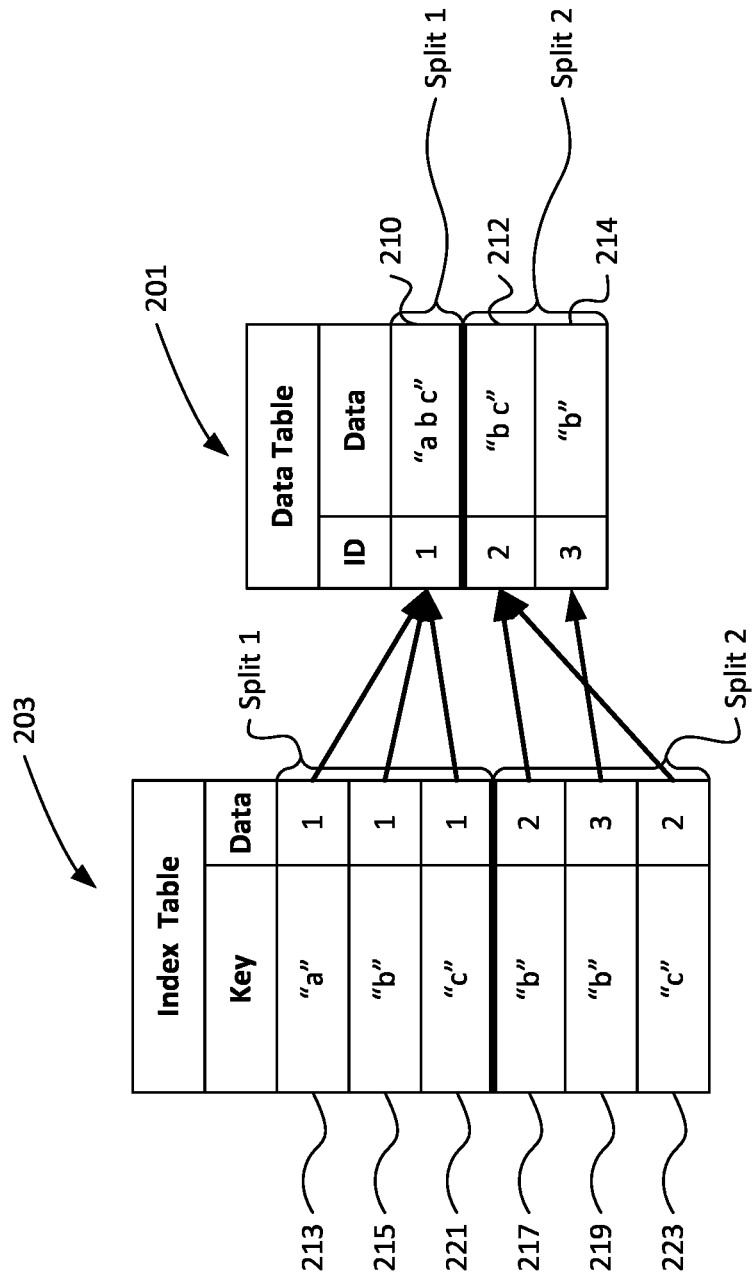
FIG. 4B is an illustration showing how keys in an index table map back to rows in a data table in accordance with aspects of the disclosure.

As shown in FIG. 4B, split 1 of index table 203 includes rows having keys 'a' 213, 'b' 215, and 'c' 221 which index all of the data in the data table row 210 identified by identifier key '1'. Split 2 of index table 203 includes rows having keys 'b' 217, 'c' 223, and 'b' 219, which index all of the data in the data table rows identified by identifier keys '2' and '3'—212 and 214, respectively. Each data split may be stored in different portions of the distributed storage system.

In some instances, the data table (or another index table) may be sharded with the index table. In this regard, rows from the data table may be sharded together with the one or more index table rows corresponding to them. In other words, data from one or more indexes for a data table may be sharded together with the data table itself. For example, the row 210 of data table 201 identified by ID '1', may be sharded into split 1 and the rows 212 and 214 of the data table 201 identified by IDs '2' and '3', respectively, may be sharded into split 2 as further shown in FIG. 4B. Sharding the data table with its corresponding index tables (i.e., index tables indexing the data of that data table) is optional; the corresponding index tables may be sharded together.

Sharding an index table into multiple splits by the keys of that index table may allow for more than one server, such as the servers of datacenters 160, 170, and/or 180, or other computing device to retrieve, search, and/or otherwise access an index table simultaneously. This may reduce the load which would otherwise fall to a single server, as well as decrease the amount of processing time.

Figure 5:
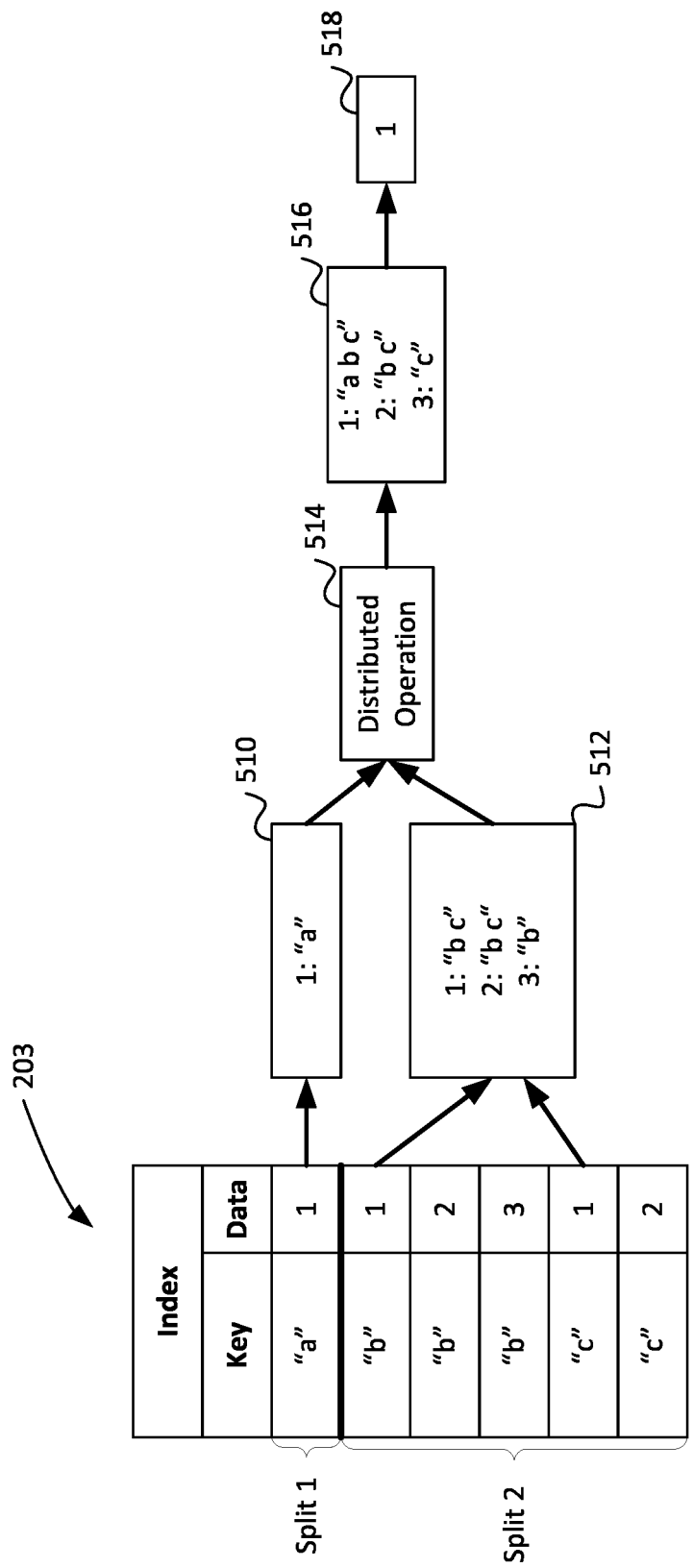
FIG. 5 is a diagram illustrating an example of searching splits in a distributed data store according to aspects of the disclosure.

For large indexes, an index table may be sharded into splits such that a number of distributed operations may be required to retrieve a non-repeating result set from the splits. For instance, and as shown in FIG. 5, index table 203 was sharded by the keys of the index table into two splits, split 1 and split 2. These splits may be searched for keys corresponding to indexed entries of data. For instance, a search may include a search for text "a b c". A server, such as server 160, may determine from the data associated with the keys in split 2 that the rows of data table 201 (not shown) identified with IDs '1' and '2' include data "b c" and ID '3' includes data "b", as shown in block 512. Another server, such as server 170, may determine from the data associated with the keys in split 1 that the row of table 201 identified with ID '1' includes "b". However, since server 160 is unaware of the contents of split 1 and server 170 is unaware of the contents of split 2, additional distributed operations, shown by block 514, such as a 'join' operation, may be performed. The distributed operation may combine the results output by servers 160 and 170, as shown in block 516. Based on the combined results, it may be determined by one or more of the servers, or another computing device, that data associated with ID '1' satisfies the search request, as shown in block 518.

Figure 6:
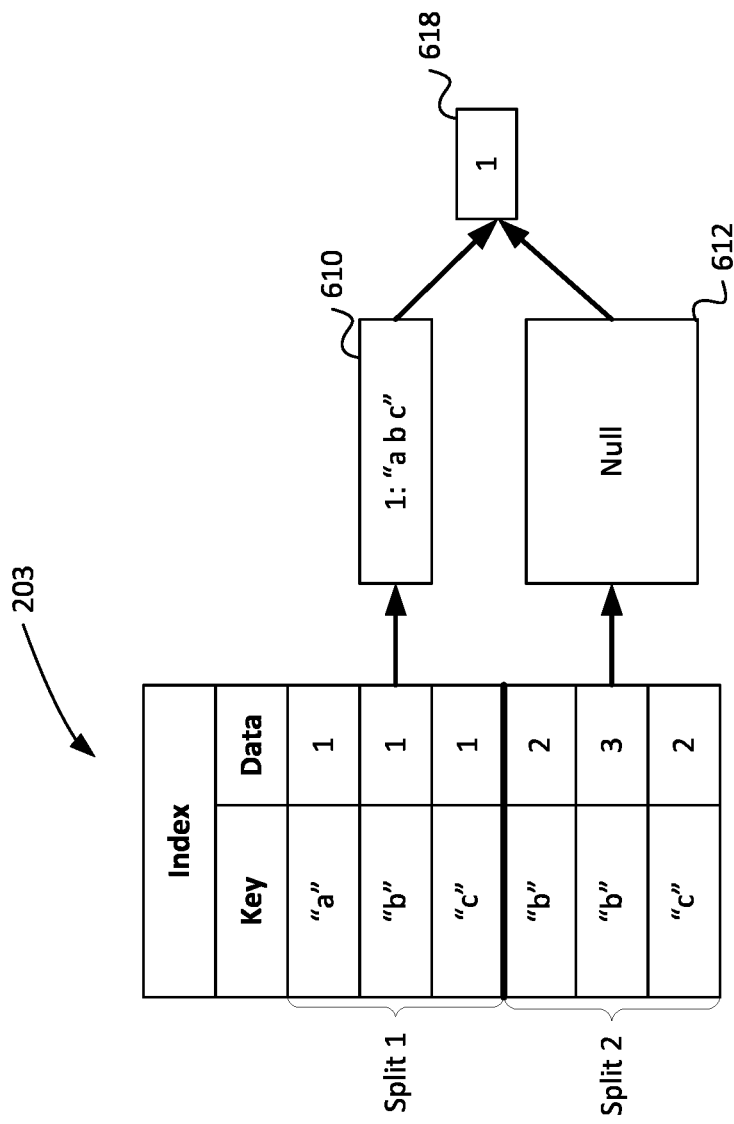
FIG. 6 is a diagram illustrating an example of searching splits in a distributed data store according to aspects of the disclosure.

Sharding an index table based on the keys of another data table and/or index table may reduce the number and expense of distributed operations required to retrieve, search, and/or otherwise access an index table. For instance and as shown in FIG. 6, index table 203 was sharded based on the keys of data table 201 (not shown). A search request may be made for keys corresponding to indexed entries of data containing text "a b c". A server, such as server 160, may determine keys in split 1 associated with the data in the row of the data table 201 identified by ID '1' satisfies the search criteria, as shown in block 610. Another server, such as server 170 and/or 180, may determine that the keys in split 2 associated with the data in the rows of the data table 201 identified by IDs '2' and '3' do not satisfy the search criteria. Since the server searching split 2 for keys corresponding to indexed entries of data containing text "a b c" knows that all data corresponding to IDs '2' and '3' are within split 2, if a full result set is not found the server may determine that IDs '2' and '3' do not satisfy the search criteria. The results of the search by the servers may be merged together and only the IDs satisfying the search criteria may be output (e.g., ID '1'), as shown in block 618. By sharding an index table based on the keys of another data table and/or index table all data within a row of a data table are indexed in the same split. As such, the number of distributed operations to search the entire index table may be reduced.

Another aspect of the technology relates to cosharding index tables by random keys assigned to data tables or other index tables to reduce hotspots. In this regard, when the identifier key of a data table monotonically increases, such as in instances where the ID corresponds to a timestamp, or the identifier monotonically decreases, new incoming data may be directed to a single server as the assigned identifiers may all be within the single server's key range. Accordingly, the single server may become burdened with processing tasks while other servers remain underutilized or unutilized. A similar burden may be placed on the single server when data within a particular range of key values is requested at the same time.

Figure 7:
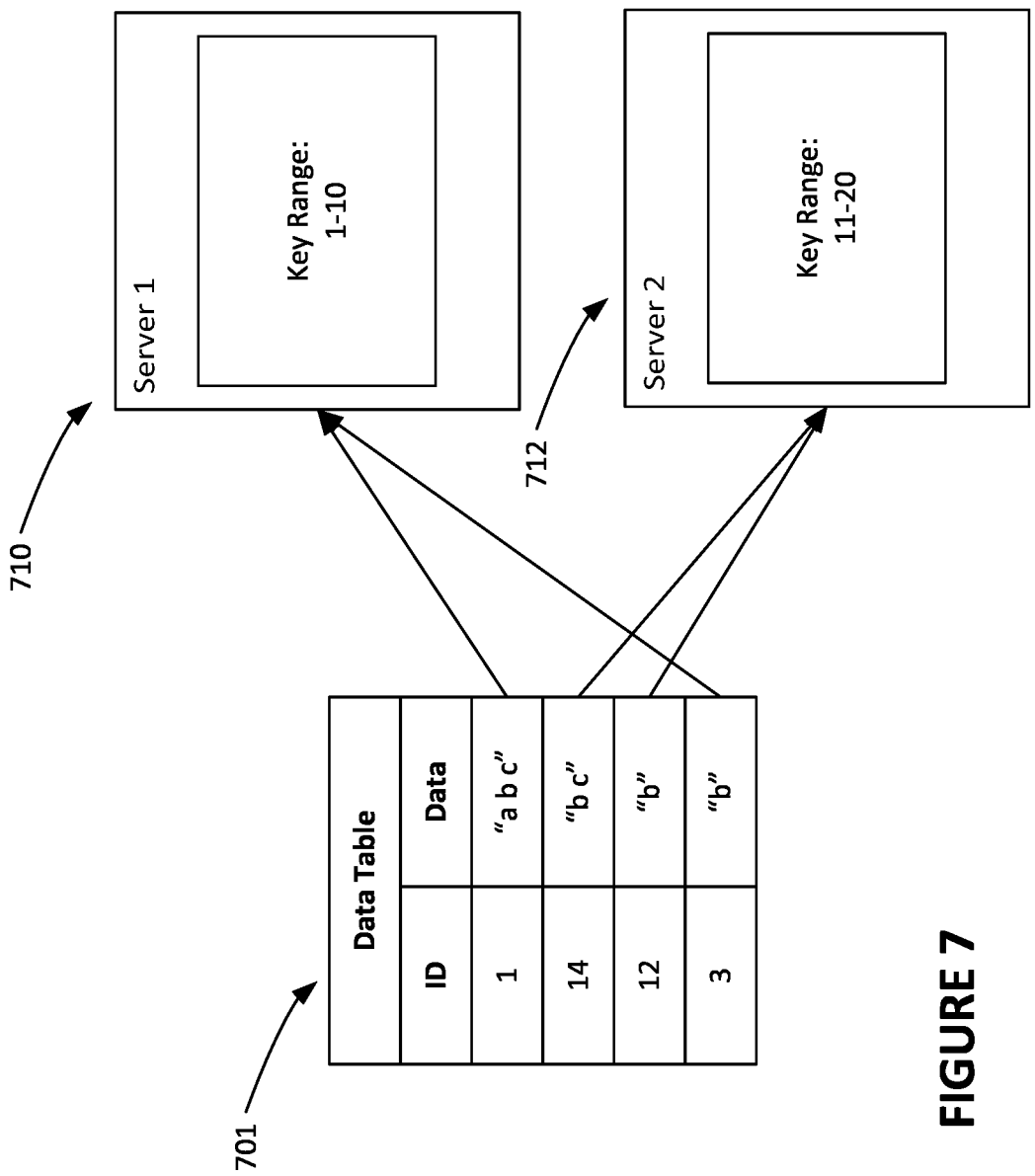
FIG. 7 is an illustration of data being assigned to servers for processing according to aspects of the disclosure.

To address this issue, the identifier values may be randomized. In this regard, a random number generator may be used to generate numbers which fall within two or more key ranges. These random numbers may be assigned to data as it is input into the distributed storage system as identifier keys (IDs) in the data table. By assigning identifiers over ranges of keys, the processing tasks may be spread amongst a plurality of servers. For instance, and as shown in FIG. 7, a first server 710 may have a key range of 1-10 and a second server 712 may have a key range of 11-20. Data within data table 701 may be received by the distributed storage system and a processor, such as controller 190 (not shown), may assign the servers with portions of the data to process based on the ID of the data. For instance, the data associated with ID 1 may be assigned to the first server 710, as 1 falls within the first server's key range of 1-10. The data associated with ID 3 may also be assigned to the first server 710. The data associated with IDs 14 and 12 may be assigned to the second server 712, as IDs 14 and 12 fall within the key range of 11-20. Although FIG. 7 illustrates two key ranges, any number of key ranges may be possible. In addition, the random numbers may not be restricted to any particular key ranges, but may be randomly generated such that they are well distributed over a large integer space, such as the entire integer 64-bit space.

Figure 8:
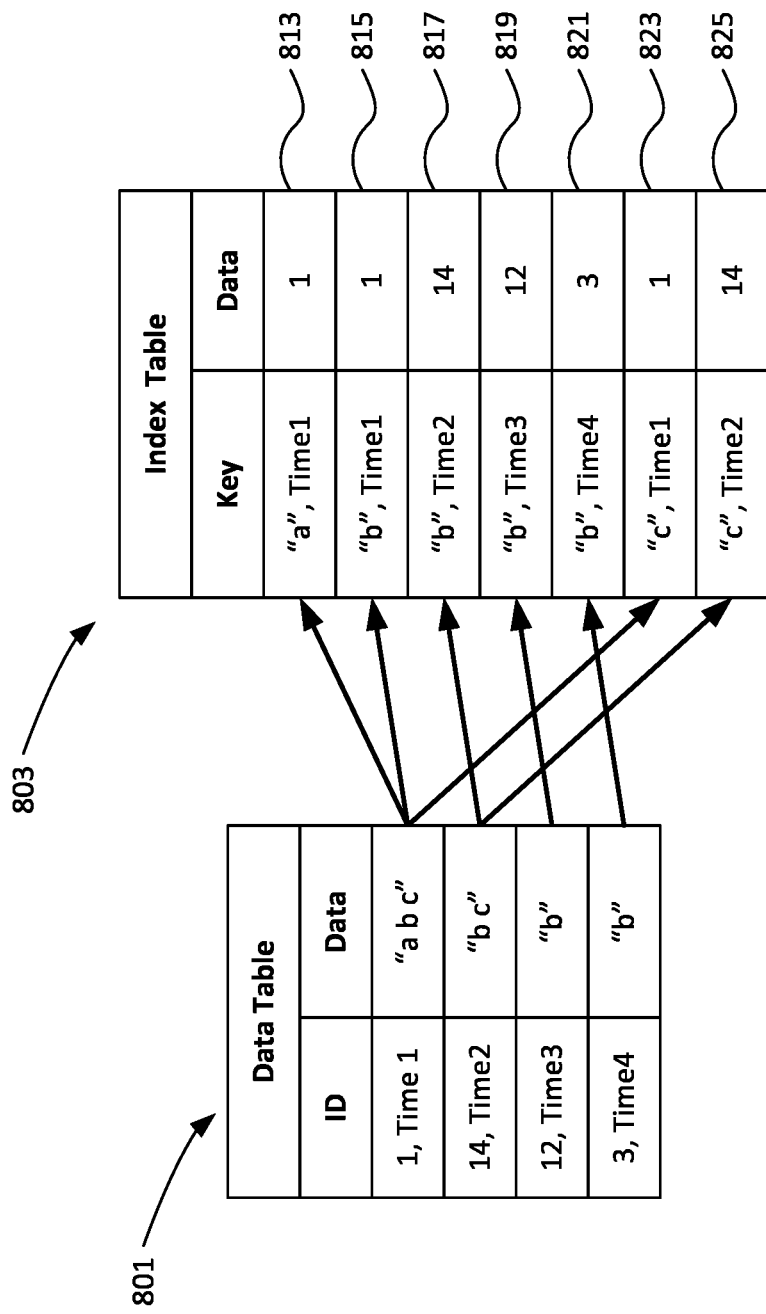
FIG. 8 is an illustration of generating an index table from a data table having randomized identifiers in accordance with aspects of the disclosure.

Data within data table 801 having may be indexed into an index table having multiple keys per row. For example, the data associated with ID 1, Time1 in data table 801 of FIG. 8, is indexed into rows 813, 815, and 823 of keys 'a, Time1', 'b, Time1', and 'c, Time1', respectively, of index table 803. The data associated with ID 14, Time2 may be indexed into rows 817 and 825 of keys 'b, Time2' and 'c, Time2', respectively. The data associated with ID 12, Time3 may be indexed into rows 819 of key 'b, Time3' and the data associated with ID 3, Time4 may be indexed into row 821 of key 'b, Time4'. The data associated with each key in the index table may correspond to data indicating the identifier key of the data table from which the data indexed into the key of the index table is located.

Figure 9:
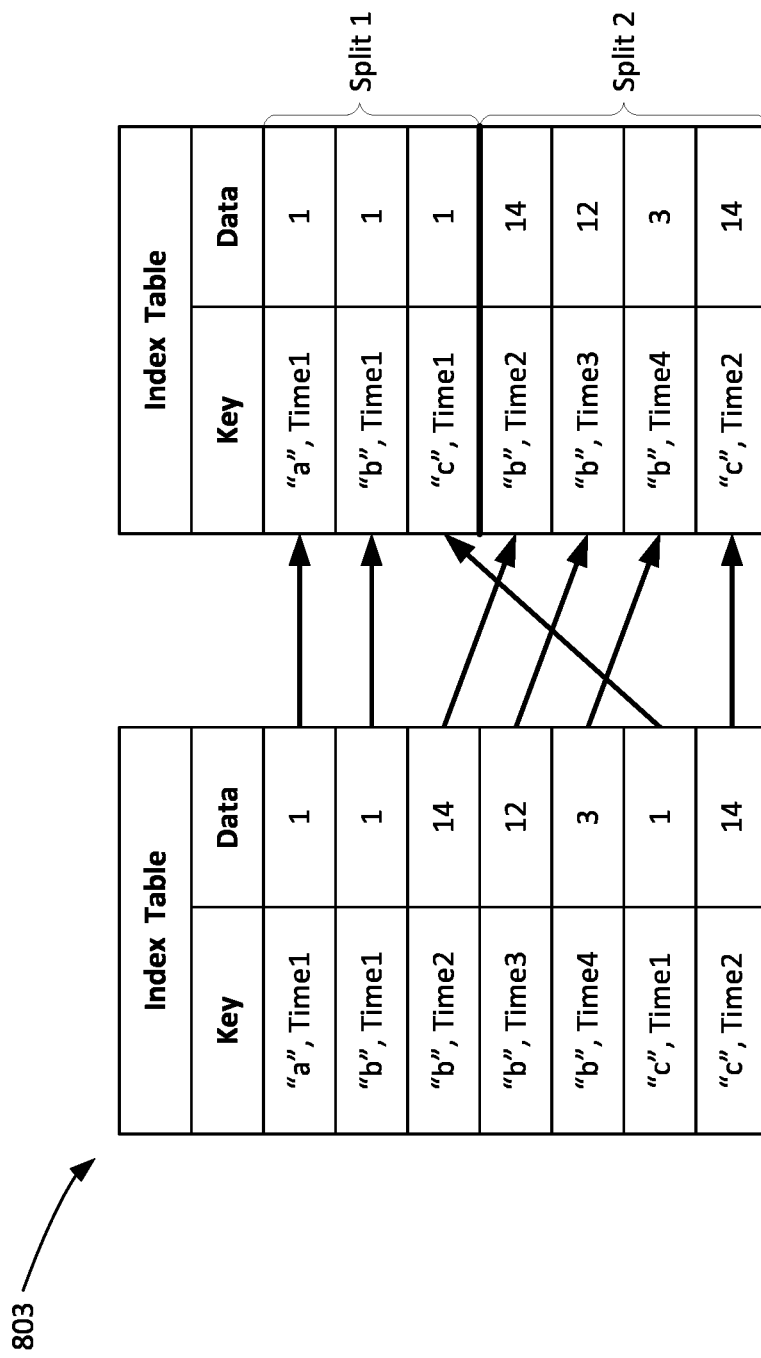
FIG. 9 is an illustration of cosharding an index table generated from a data table having randomized identifiers in accordance with aspects of the disclosure.

The index may be cosharded by the random identifier keys assigned to data table 801. For instance, as shown in FIG. 9 rows corresponding to keys 'a', 'b', and 'c' having data corresponding to ID 1 of table 801 may be sharded into split 1 and rows corresponding to keys 'b' and 'c' having data corresponding to IDs 3, 14, and 12 may be sharded into split 2.

In some instances, each split may be arranged in a particular order, such as by a value of an identifier key or timestamp. For example, as further shown in FIG. 9, the rows of the split may be arranged by the "time" identifier key stored in the index table data and which corresponds to the timestamp of the data in the data table 801.

By arranging the rows of the splits data in an order, retrieval, searching, and/or otherwise accessing portions of index table may be performed more quickly, as only a portion of the splits may need to be traversed. For example, if an inquiry for keys having data associated with "Time2" in the index table 803 is made, the distributed storage system may stop traversing the second split after reaching the row corresponding to key 'b' and having a time of "Time3", as keys having data associated with Time2 are grouped together. Similarly, the distributed storage system may traverse the rows corresponding to keys 'c', stopping once no further entries are found or another time is reached (e.g., Time3).

Figure 10:
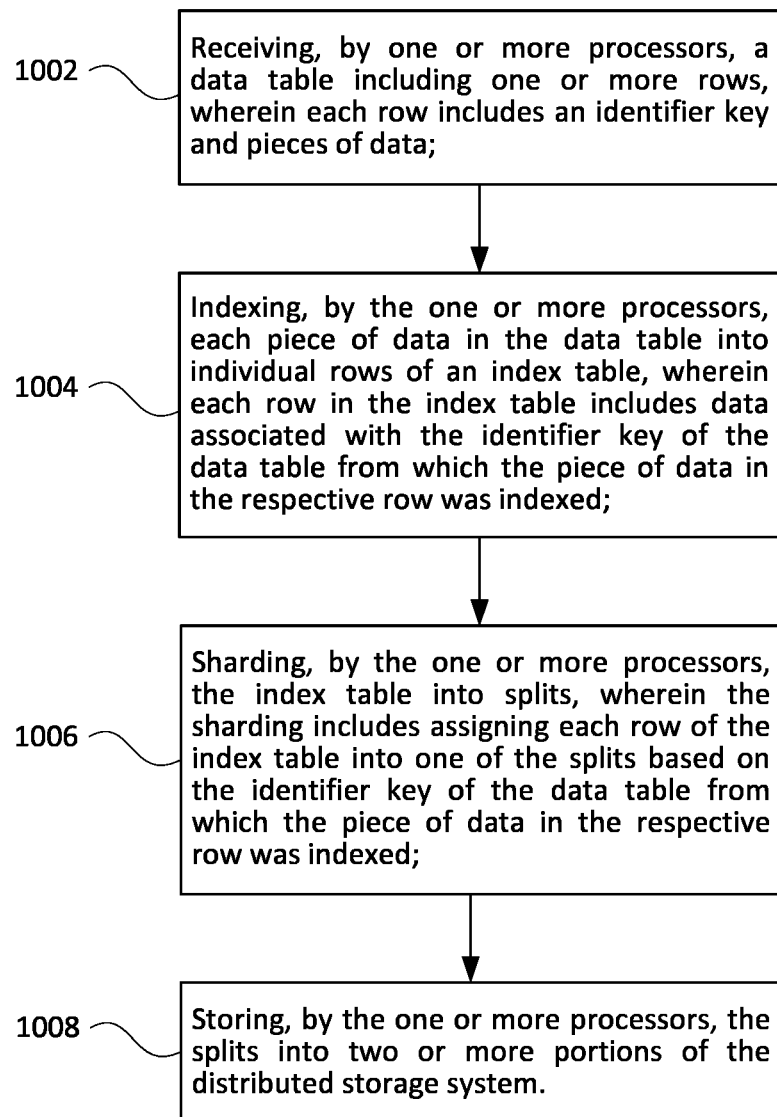
FIG. 10 is a flow diagram in accordance with aspects of the disclosure.

FIG. 10 illustrates a flow diagram 1000 of a method for cosharding a table within a distributed storage system. In this regard, at block 1002 one or more processors, such as processors 120, may receive a data table including one or more rows, wherein each row includes an identifier key and pieces of data. As shown at block 1004, each piece of data in the data table may be indexed into individual rows of an index table, wherein each row in the index table includes data associated with the identifier key of the data table from which the piece of data in the respective row was indexed. As shown in block 1006, the index table may be sharded into splits, wherein the sharding includes assigning each row of the index table into one of the splits based on the identifier key of the data table from which the piece of data in the respective row was indexed. The splits may be stored into two or more portions of the distributed storage system, as shown in block 1008.

The features described herein allow for improved retrieval speeds of data spread across splits. In this regard, time consuming join operations may be locally performed by sharding an index into splits by source, such that all data corresponding to one source is found in a single split. The features described herein also avoid the formation of hotspots at particular servers during the input and retrieval of data while maintaining desirable on-disk sort order.

Unless otherwise stated, the foregoing alternative examples are not mutually exclusive, but may be implemented in various combinations to achieve unique advantages. As these and other variations and combinations of the features discussed above can be utilized without departing from the subject matter defined by the claims, the foregoing description of the embodiments should be taken by way of illustration rather than by way of limitation of the subject matter defined by the claims. In addition, the provision of the examples described herein, as well as clauses phrased as "such as," "including" and the like, should not be interpreted as limiting the subject matter of the claims to the specific examples; rather, the examples are intended to illustrate only one of many possible embodiments. Further, the same reference numbers in different drawings can identify the same or similar elements.

The invention claimed is:

1. A method for cosharding tables within a distributed storage system, the method comprising:
   receiving, by one or more processors, a data table including one or more rows, wherein each row includes one or more pieces of data and an identifier key assigned to each piece of data, wherein each identifier key is a randomly generated value within a specified range of values;
   indexing, by the one or more processors, each piece of the one or more pieces of data in the data table into an individual row of one of a plurality of index tables stored on separate portions of the distributed storage system, wherein each row in the plurality of index tables includes a piece of the one or more pieces of data and the identifier key of the row of the data table from which the piece of data was indexed;
   sharding, by the one or more processors, each of the plurality of index tables into splits, wherein the sharding includes assigning each row of the plurality of index tables into a respective one of the splits based on the identifier key of the data table from which the piece of data in the respective row was indexed; and
   sharding each row of the one or more rows of the data table, such that each row is together with the individual row of the index table to which the piece of data of the respective row of the data table was indexed.

2. The method of claim 1, wherein each of the separate portions of the distributed storage system is assigned a range subset within the specified range of values.

3. The method of claim 1, wherein indexing each piece of the one or more pieces of data includes, for each piece of the one or more pieces of data in the data table:
   comparing the identifier assigned to the piece of data to the range subsets to determine a portion of the portions of the distributed storage system assigned a range subset covering the identifier assigned to the piece of data; and
   indexing the piece of data to an index table stored on the portion of the distributed storage system assigned the range subset covering the identifier assigned to the piece of data.

4. The method of claim 1, wherein the sharded one or more rows from the data table are stored in the same split as the individual row of the index table to which the pieces of data of the respective row of the data table were indexed.

5. The method of claim 1, wherein the data in the data table is in one or more columns of the data table.

6. The method of claim 1, wherein the identifier key further includes a timestamp, and the splits are sorted by the timestamp.

7. A system for cosharding a table, the system comprising:
   a distributed storage system; and
   one or more processors, wherein the one or more processors are configured to:
   receive a data table including one or more rows, wherein each row includes one or more pieces of data and an identifier key assigned to each piece of data, wherein each identifier key is a randomly generated value within a specified range of values;
   index each piece of the one or more pieces of data in the data table into an individual row of one of a plurality of index tables stored on separate portions of the distributed storage system, wherein each row in the plurality of index tables includes a piece of the one or more pieces of data and the identifier key of the row of the data table from which the piece of data was indexed;

shard each of the plurality of index tables into splits, wherein the sharding includes assigning each row of the plurality of index tables into a respective one of the splits based on the identifier key of the data table from which the piece of data in the respective row was indexed; and shard each row of the one or more rows of the data table, such that each row is together with the individual row of the index table to which the piece of data of the respective row of the data table was indexed.

8. The system of claim 7, wherein each of the separate portions of the distributed storage system is assigned a range subset within the specified range of values.

9. The system of claim 7, wherein indexing each piece of the one or more pieces of data includes, for each piece of the one or more pieces of data in the data table:

comparing the identifier assigned to the piece of data to the range subsets to determine a portion of the portions of the distributed storage system assigned a range subset covering the identifier assigned to the piece of data; and indexing the piece of data to an index table stored on the portion of the distributed storage system assigned the range subset covering the identifier assigned to the piece of data.

10. The system of claim 7, wherein the sharded one or more rows from the data table are stored in the same split as the individual row of the index table to which the pieces of data of the respective row of the data table were indexed.

11. The system of claim 7, wherein the data in the data table is in one or more columns of the data table.

12. The system of claim 7, wherein the identifier key further includes a timestamp, and the splits are sorted by the timestamp.

13. A non-transitory computer-readable medium storing instructions, which when executed by one or more processors, cause the one or more processors to:

receive a data table including one or more rows, wherein each row includes one or more pieces of data and an identifier key assigned to each piece of data, wherein each identifier key is a randomly generated value within a specified range of values;

index each piece of the one or more pieces of data in the data table into an individual row of one of a plurality of index tables stored on separate portions of a distributed storage system, wherein each row in the plurality of index tables includes a piece of the one or more pieces of data and the identifier key of the row of the data table from which the piece of data was indexed;

shard each of the plurality of index tables into splits, wherein the sharding includes assigning each row of the plurality of index tables into a respective one of the splits based on the identifier key of the data table from which the piece of data in the respective row was indexed; and shard each row of the one or more rows of the data table, such that each row is together with the individual row of the index table to which the piece of data of the respective row of the data table was indexed.

14. The non-transitory computer-readable medium of claim 13, wherein each of the separate portions of the distributed storage system is assigned a range subset within the specified range of values.

15. The non-transitory computer-readable medium of claim 13, wherein indexing each piece of the one or more pieces of data includes, for each piece of the one or more pieces of data in the data table:

comparing the identifier assigned to the piece of data to the range subsets to determine a portion of the portions of the distributed storage system assigned a range subset covering the identifier assigned to the piece of data; and indexing the piece of data to an index table stored on the portion of the distributed storage system assigned the range subset covering the identifier assigned to the piece of data.

16. The non-transitory computer-readable medium of claim 13, wherein the sharded one or more rows from the data table are stored in the same split as the individual row of the index table to which the pieces of data of the respective row of the data table were indexed.

17. The non-transitory computer-readable medium of claim 13, wherein the data in the data table is in one or more columns of the data table.

* * * * *

UNITED STATES PATENT AND TRADEMARK OFFICE
CERTIFICATE OF CORRECTION

| | | |
|---|---|---|
| PATENT NO. | : 11,816,086 B2 | Page 1 of 1 |
| APPLICATION NO. | : 18/069519 | |
| DATED | : November 14, 2023 | |
| INVENTOR(S) | : Alexander Khesin, Alexander Lloyd and Sebastian Kanthak | |

It is certified that error appears in the above-identified patent and that said Letters Patent is hereby corrected as shown below:

On the Title Page

Under Item (63) Related U.S. Application Data, please delete the "Provisional application No. 62/821,256" and insert the following:
--Provisional application No. 62/821,156--

Signed and Sealed this
Second Day of January, 2024

*Katherine Kelly Vidal*

Katherine Kelly Vidal
*Director of the United States Patent and Trademark Office*